(12) United States Patent
Pan et al.

(10) Patent No.: US 12,120,828 B2
(45) Date of Patent: Oct. 15, 2024

(54) REEL MECHANISM AND WINDING DEVICE FOR FLEXIBLE COPPER CLAD LAMINATE

(71) Applicant: AAC Technologies (Nanjing) Co., Ltd., Nanjing (CN)

(72) Inventors: Rui Pan, Shenzhen (CN); Hongyuan Wang, Shenzhen (CN); Yilan Zhang, Shenzhen (CN); Hezhi Wang, Shenzhen (CN)

(73) Assignee: AAC Technologies (Nanjing) Co., Ltd., Nanjing (CN)

( * ) Notice: Subject to any disclaimer, the term of this patent is extended or adjusted under 35 U.S.C. 154(b) by 367 days.

(21) Appl. No.: 17/835,873

(22) Filed: Jun. 8, 2022

(65) Prior Publication Data
US 2023/0217597 A1     Jul. 6, 2023

(30) Foreign Application Priority Data
Dec. 31, 2021 (CN) .......................... 202123438065.9

(51) Int. Cl.
*H05K 3/00* (2006.01)
*H05K 1/03* (2006.01)
*H05K 3/02* (2006.01)

(52) U.S. Cl.
CPC ......... *H05K 3/0044* (2013.01); *H05K 1/0313* (2013.01); *H05K 3/022* (2013.01); *H05K 2201/0154* (2013.01); *H05K 2201/0355* (2013.01); *H05K 2203/1545* (2013.01)

(58) Field of Classification Search
CPC .... H05K 3/0044; H05K 3/022; H05K 1/0313; H05K 2201/0154; H05K 2201/0355; H05K 2203/1545
See application file for complete search history.

(56) References Cited

U.S. PATENT DOCUMENTS

| | | | | |
|---|---|---|---|---|
| 5,156,716 A | * | 10/1992 | Parthasarathi .... | H01L 23/49572 216/58 |
| 2006/0124228 A1 | * | 6/2006 | Lee ........................ | B32B 27/281 156/199 |

FOREIGN PATENT DOCUMENTS

| | | | | | |
|---|---|---|---|---|---|
| CN | 102223960 A | * | 10/2011 | ............. | B21C 47/04 |
| JP | 4218768 B2 | * | 2/2009 | ........... | H05K 1/0266 |
| KR | 100666282 B1 | * | 1/2007 | ........... | H05K 3/0044 |

* cited by examiner

*Primary Examiner* — Emmanuel M Marcelo
(74) *Attorney, Agent, or Firm* — W&G Law Group

(57) ABSTRACT

A reel mechanism and a winding device for a flexible copper clad laminate includes a rotating roller, a winding belt wound on the rotating roller for winding the flexible copper clad laminate, first and second limit structures arranged one side of the winding belt away from the rotating roller. A space between the first limit structures and the second limit structures accommodates the flexible copper clad laminate. When the winding belt is wound with multiple layers outside the rotating roller, adjacent layers of the winding belt are spaced apart by the first and second limit structures. Since a protruding height of the first limit structures is equal to a protruding height of the second limit structures, and intervals between adjacent layers of a composite coil formed by the winding belt and the flexible copper clad laminate are equal, which avoids adhesion and copper foil surface oxidation.

10 Claims, 3 Drawing Sheets

REEL MECHANISM AND WINDING DEVICE FOR FLEXIBLE COPPER CLAD LAMINATE

TECHNICAL FIELD

The present disclosure relates to a technical field of flexible copper clad laminate manufacturing, and in particular to a reel mechanism and a winding device for a flexible copper clad laminate

BACKGROUND

Flexible copper clad laminate (FCCL) refers to a single-sided or double-sided copper clad laminate formed by bonding insulating materials such as polyimide and copper foil together through a certain process. Compared with conventional rigid copper clad laminates, the flexible copper clad laminate are thin, light and flexible, so they are widely used in mobile phones, digital cameras, automotive satellite orientation devices, LCD TVs, notebook computers, and other microelectronic products.

There are mainly two imidization methods for preparing polyimide single-sided flexible copper clad laminates in the prior art.

The first one is to uses a high-temperature tunnel furnace for on-line continuous imidization. However, an imidization furnace is expensive, delivery time of the imidization furnace is long, and process cost is high, sot the imidization furnace is relatively rarely used in the FCCL manufacturing industry in China. The second one is to carry out off-line imidization after a single-sided FCCL is unwound by an unreeling machine. This method requires less equipment investment and simple process, so this method is adopted by many FCCL manufacturers in China.

However, in actual application process, following problems are prone to occur after the single-sided FCCL is unwound by the unreeling machine. Firstly, a distance between layers of the single-sided FCCL is difficult to control, which is easy to cause adhesion between layers, and makes a large difference in solvent volatilization speed, leading to problems such as adhesion and copper foil surface oxidation in the single-sided FCCL and resulting in a decrease in a product qualification rate. Secondly, a copper foil used in a non-adhesive single-sided FCCL is relatively thin, and there is no other support at a bottom or a front of the non-adhesive single-sided FCCL when it is directly unwound, which is prone to wrinkle deformation of the single-sided FCCL. Thirdly, after the single-sided FCCL is imidized, the single-sided FCCL needs to be wound and cut. Since a motor frequency of a reeling and unreeling machine is fixed, it is easy to cause deformation between layers of the single-sided FCCL and is scratched between layers of the single-sided FCCL due to inconsistent tension between the layers, which seriously affect the product quality.

Therefore, it is necessary to provide a reel mechanism and a winding device for a flexible copper clad laminate to solve the above problems.

SUMMARY

The present disclosure provides a reel mechanism and a winding device for a flexible copper clad laminate to solve a technical problem in the prior art that a distance between layers of a single-sided flexible copper clad laminate is difficult to control after the single-sided flexible copper clad laminate is unwound by an unreeling machine.

The present disclosure provides a reel mechanism. The reel mechanism comprises a rotating roller, and a winding belt wound around a surface of the rotating roller. The winding belt is configured for winding the flexible copper clad laminate. The reel mechanism further comprises first limit structures and second limit structures. The first limit structures and the second limit structures are arranged on one side of the winding belt away from the rotating roller. The first limit structures are spaced apart from the second limit structures in an axial direction of the rotating roller. The first limit structures and the second limit structures are arranged along a length direction of the winding belt. The first limit structures and the second limit structures protrude from a surface of the winding belt. A space between the first limit structures and the second limit structures is configured for accommodating the flexible copper clad laminate. When the winding belt is wound with at least two layers outside the rotating roller, adjacent layers of the winding belt are spaced apart by the first limit structures and the second limit structures.

Optionally, the first limit structures comprise at least two first limiters fixed on the one side of the winding belt away from the rotating roller and arranged along the length direction of the winding belt. The second limit structures comprise at least two second limiters fixed on the one side of the winding belt away from the rotating roller and arranged along the length direction of the winding belt. The first limiters and the second limiters protrude from the surface of the winding belt. A protruding height of the first limiters and a protruding height of the second limiters are in a range of 0.1 cm-1 cm.

Optionally, the protruding height of the first limiters is equal to the protruding height of the second limiters.

Optionally, an amount of the first limiters is equal to an amount of the second limiters, and the first limiters and the second limiters are respectively arranged on two sides of the winding belt.

Optionally, the first limiters are arranged at intervals. An interval between each two adjacent first limiters is in a range of 0.05 m-0.35 m. The second limiters are arranged at intervals. An interval between each two adjacent second limiters is in a range of 0.05 m-0.35 m.

Optionally, the first limiters and the second limiters are metal limiters.

Optionally, the first limiters and the second limiters are cage nuts.

Optionally, a thickness of the winding belt is in a range of 5 um-550 um.

The present disclosure further provides a winding device for the flexible copper clad laminate. The winding device for the flexible copper clad laminate comprises the reel mechanism mentioned above, a driving component connected with the reel mechanism, and the flexible copper clad laminate stacked on the surface of the winding belt away from the rotating roller.

The driving component is connected with the rotating roller.

Optionally, the flexible copper clad laminate comprises a metal foil and a film layer stacked on one side of the metal foil away from the winding belt. The film layer is a polyamic acid film or a liquid crystal polymer film.

In the present disclosure, since the first limit structures and the second limit structures protrude from the surface of the winding belt, when the winding belt is wound with multiple layers outside the rotating roller, each two adjacent layers of the winding belt are spaced apart by the first limit structures and the second limit structures, making adjacent layers of a composite coil formed by the winding belt and the flexible copper clad laminate have a same spacing, which is beneficial to achieve a same volatilization speed of solvent between the layers of the composite coil during a subsequent imidization process of the composite coil and avoids problems such as adhesion and copper foil surface oxidation of the flexible copper clad laminate during imidization, thereby improving a product qualification rate. Meanwhile, the winding belt is closely attached to the flexible copper clad laminate, so the tension of the winding belt and the flexible copper clad laminate is kept constant during a process of forming the composite coil, which avoids wrinkling and deformation of the flexible copper clad laminate due to when the flexible copper clad laminate is not supported during winding.

DETAILED DESCRIPTION

Figure 1:
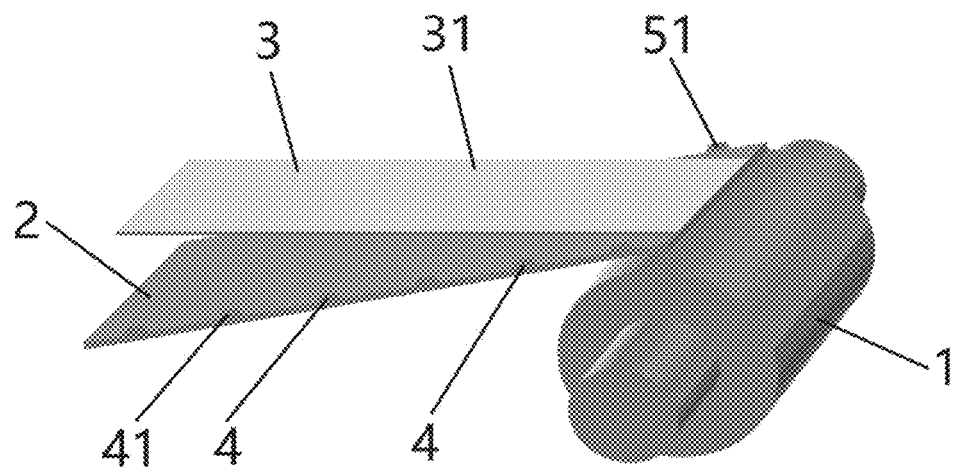
FIG. 1 is a schematic diagram showing an overall structure of a reel mechanism of the present disclosure.
Figure 2:
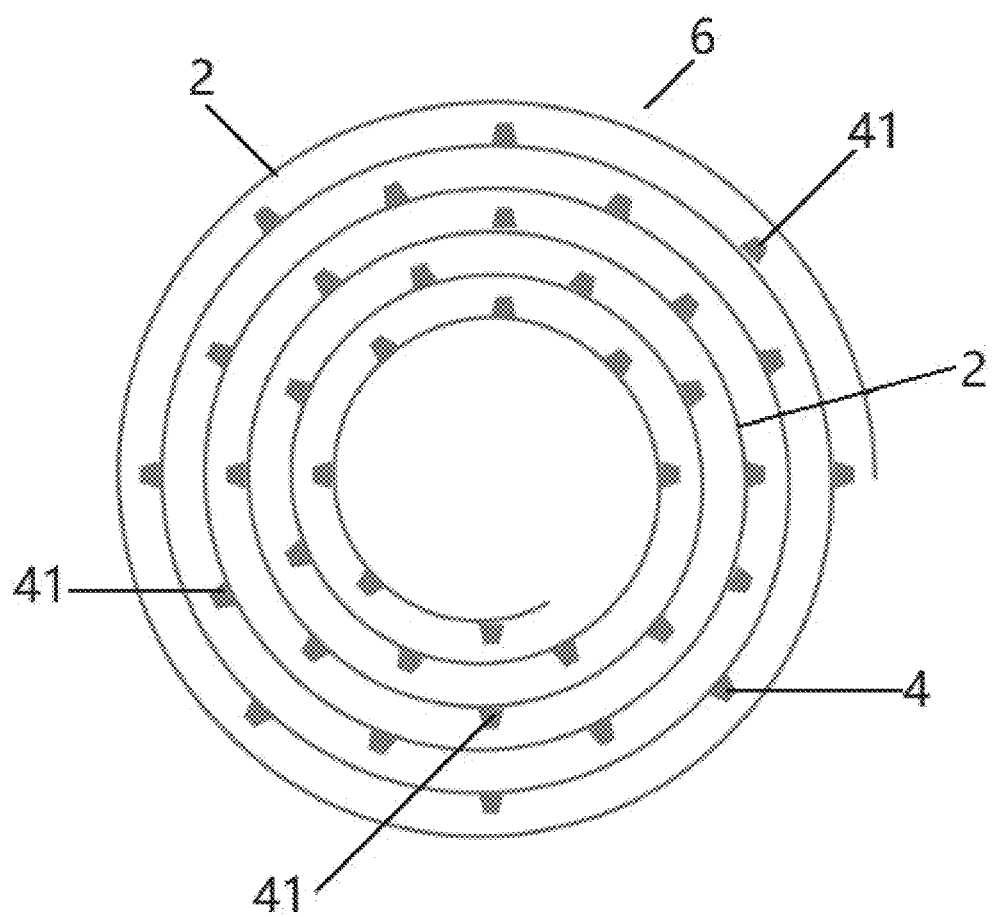
FIG. 2 is a left side schematic diagram showing a composite coil of a winding device for a flexible copper clad laminate of the present disclosure where the flexible copper clad laminate is removed.
Figure 3:
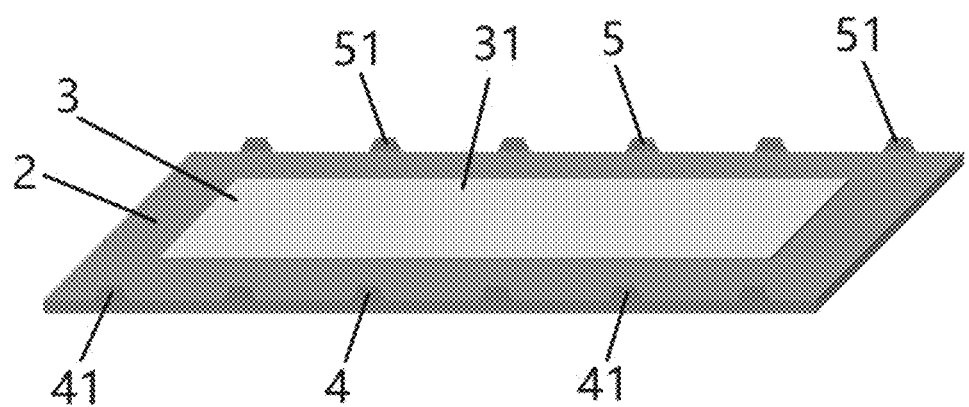
FIG. 3 is a top schematic diagram showing the composite coil of the winding device for the flexible copper clad laminate of the present disclosure where the composite coil is in an unwinding state.

The present disclosure will be further described below with reference to the accompanying drawings and embodiments.

As shown in the drawings, in one embodiment, the present disclosure provides a winding device for a flexible copper clad laminate. The winding device for the flexible copper clad laminate comprises a driving component, a reel mechanism connected with the driving component, and the flexible copper clad laminate 3 stacked on a surface of a winding belt 2 away from a rotating roller 1

As shown in the drawings, in one embodiment, the reel mechanism comprises the rotating roller 1, and the winding belt 2 wound around a surface of the rotating roller 1. The winding belt 2 is configured for winding the flexible copper clad laminate 3. The reel mechanism further comprises first limit structures 4 and second limit structures 5. The first limit structures 4 and the second limit structures 5 are arranged on one side of the winding belt 2 away from the rotating roller 1. The first limit structures 4 are spaced apart from the second limit structures 5. A space between the first limit structures 4 and the second limit structures 5 is configured for accommodating the flexible copper clad laminate 3. The first limit structures 4 and the second limit structures 5 protrude from a surface of the winding belt 2. When the winding belt 2 is wound with at least two layers outside the rotating roller, adjacent layers of the winding belt 2 are spaced apart by the first limit structures 4 and the second limit structures 5, making adjacent layers of a composite coil 6 formed by the winding belt 2 and the flexible copper clad laminate 3 have a same interval, which is beneficial to achieve a same volatilization speed of solvent between the layers of the composite coil 6 during a subsequent imidization process of the composite coil 6, and avoids problems such as adhesion and copper foil surface oxidation of the flexible copper clad laminate 3 during imidization, thereby improving a product qualification rate. Meanwhile, the winding belt 2 is closely attached to the flexible copper clad laminate 3, so the tension of the winding belt 2 and the flexible copper clad laminate 3 is kept constant during a process of forming the composite coil 6, which avoids wrinkling and deformation of the flexible copper clad laminate when the flexible copper clad laminate is not supported during winding.

As shown in the drawings, in one embodiment, the first limit structures 4 comprise at least two first limiters 41 fixed on the one side of the winding belt 2 away from the rotating roller 1 and arranged along the length direction of the winding belt 2. The second limit structures 5 comprise at least two second limiters 51 fixed on the one side of the winding belt 2 away from the rotating roller 1 and arranged along the length direction of the winding belt 2. The first limiters 41 and the second limiters 51 protrude from the surface of the winding belt 2. A protruding height of the first limiters 41 is equal to a protruding height of the second limiters 51. Specifically, a large number of first limiters 41 and second limiters 51 are arranged on the winding belt 2. The first limiters 41 are arranged at intervals. An interval between each two adjacent first limiters 41 is in a range of 0.05 m-0.35 m. The second limiters are 51 arranged at intervals. An interval between each two adjacent second limiters 51 is in a range of 0.05 m-0.35 m. Optionally, the first limiters 41 are arranged at equal intervals, and the second limiters 51 are arranged at equal intervals. The interval between each two adjacent first limiters 41 is equal to the intervals between each two adjacent second limiters 51, so that supporting force provided by the first limiters 41 and the second limiters 51 to the layers of the composite coil 6 is balanced, which ensure the adjacent layers of the composite coil 6 to have a same interval. The interval between each two adjacent first limiters 41/second limiters 51 ranges from 0.1 m to 0.3 m. Under a condition that the first limiters 41 and the second limiters 51 provide sufficient supporting force, the volatilization speed of the solvent between the layers of the composite coil 6 is improved.

Further, a protruding height of the first limiters 41 and a protruding height of the second limiters 51 are in a range of 0.1 cm-1 cm. It is understood that when the protruding height of the first limiters 41/the second limiters 51 protruding from the surface of the winding belt 2 is less than 0.1 cm, a distance between each two adjacent layers of the composite coil 6 is less than 0.1 cm, so that the volatilization speed of the solvent is slow. When the protruding height of the first limiters 41/the second limiters 51 protruding from the surface of the winding belt 2 is greater than 1 cm, the distance between each two adjacent layers of the composite coil 6 is greater than 1 cm, a space required for imidization increases, resulting in lower production efficiency and higher energy consumption. In other embodiments, the intervals between each two adjacent first limiters 41/second limiters 51 may be zero. That is, the first limiters 41/the second limiters 51 form a long strip.

As shown in the drawings, in one embodiment, an amount of the first limiters 41 is equal to an amount of the second limiters 51, and the first limiters 41 and the second limiters 51 are respectively arranged on two sides of the winding belt 2. Specifically, each of the first limiters 41 of the first limit structures 4 is arranged opposite to each of the second limiters 51 of the second limit structures 5 to further ensure that the supporting force provided by the first limiters 41 and the second limiters 51 to the layers of the composite coil 6 is balanced. The first limiters 41 and the second limiters 51 are respectively arranged on two sides of the winding belt 2, so that the space between the first limit structures 4 and the second limit structures 5 is set to be greatest, which is favorable for accommodating a large size of the flexible copper clad laminate 3. Therefore, the flexible copper clad laminates 3 of different specifications are adapted to the winding belt 2.

The first limiters 41 and the second limiters 51 are metal limiters. In one embodiment, the first limiters 41 and the second limiters 51 are cage nuts. Specifically, the first limiters 41 are same as the second limiters 51. The first limiters 41 and the second limiter 51 may be stainless steel cage nuts, or may be made of other high temperature resistant (350° C.-400° C.), corrosion-resistant metal materials, such as iron, nickel and chromium, etc. The cage nuts may cooperate with screws to adjust the interval between each two adjacent layers of the winding belts 2 within 0.05 cm-1.5 cm, which are convenient for adjustment of the interval of each two adjacent layers of the winding belts 2. In other embodiments, while ensuring that the first limiters 41 and the second limiters 51 are not affected by the high temperature and corrosion in the subsequent imidization process, the first limiters 41 and the second limiters 51 are made of materials according to actual needs. The first limiter 41 and the second limiter 51 are trapezoidal blocks or rectangular blocks, which are not limited hereto.

As shown in the drawings, in one embodiment, a thickness of the winding belt 2 is in a range of 5 um-550 um. A length of the winding belt 2 is in a range of 5-55 m. Specifically, the winding belt 2 is a steel belt, which is conducive to providing the supporting force to the flexible copper clad laminate 3. Optionally, the thickness of the winding belt 2 ranges from 10 um-500 um, and the length of the winding belt 2 ranges from 10 m-50 m.

When the thickness of the winding belt 2 is less than 10 um, the supporting force provided is small because the winding belt 2 is too thin. When the thickness of the winding belt 2 is greater than 500 um, space occupied by the winding belt 2 and the winding tension are large. The length of the winding belt 2 ranges from 10 m-50 m, which ensures that a volume of the composite coil 6 formed by the winding belt 2 and the flexible copper clad laminate 3 is neither too large nor too small, and is beneficial to the imidization process of the composite coil 6.

As shown in the drawings, in one embodiment, the driving component is connected with the rotating roller 1.

A film layer 31 to be processed is stacked on a surface of the flexible copper clad laminate 3 away from the rotating roller 1, and film layer 31 to be processed is a polyamic acid film or a liquid crystal polymer film.

Specifically, the driving component and the rotating roller 1 form a hoist. The driving component comprises a motor, and the motor drives the rotating roller 1 to rotate, thereby driving the winding belt 2 and the flexible copper clad laminate 3 to continuously wind, and finally form the composite coil 6 formed by the winding belt 2 and the flexible copper clad laminate 3. The flexible copper clad laminate 3 is a glue-free single-sided flexible copper clad laminate 3. The flexible copper clad laminate 3 comprises a metal foil and the film layer 31 stacked on one side of the metal foil away from the winding belt 2. The film layer is a polyamic acid film or a liquid crystal polymer film. For example, the metal foil is copper foil. When the film layer 31 is a PAA film (the polyamic acid film), a temperature required for imidization of the PAA film ranges from 300° C.-400° C. When the film layer 31 to processed is an LCP film (the liquid crystal polymer film), a temperature for curing the LCP film ranges from 200° C.~300° C. A winding speed of the winding belt 2 ranges from 0.15 m/s-0.55 m/s. Optionally, the winding speed of the winding belt 2 ranges from 0.2 m/s-0.5 m/s, which is conducive to stably winding the flexible copper clad laminate 3. It is understood that after the flexible copper clad laminate 3 is stacked on the winding belt 2, the side with the film layer 31 is on the top, and a metal surface of the flexible copper clad laminate 3 attached to the winding belt 2 is on the bottom. The motor drives the rotating roller 1 to rotate, and the flexible The copper clad laminate 3 and the winding tape 2 are compositely wound to form the composite coil 6, The composite coil 6 after winding is placed in a high-temperature vacuum oven, and the imidization process of the semi-cured glue-free single-sided flexible copper clad laminate 3 is carried out according to a procedure. Then the imidized composite coil 6 is sleeved on a reel for unwinding. The winding belt 2 is recovered for reuse. Finally, the flexible copper clad laminate 3 is wound, packaged and stored.

In the embodiment, in order to improve production efficiency and product quality, tests are carried out. Test parameters and results are shown in Table 1 below. Table 1 shows the test results of the winding device for the flexible copper clad laminate under relevant parameters.

TABLE 1

| Program | Thickness of the winding belt (um) | Intervals of the first limiters/ second limiters (m) | Height of the first limiters/ second limiters (cm) | Winding speed of the winding belt (m/s) | Length of the winding belt (m) | Finished Appearance | Remark |
|---|---|---|---|---|---|---|---|
| Test 1 | 10 | 0.1 | 0.2 | 0.2 | 30 | Poor | The winding belt is too thin to support |
| Test 2 | 50 | 0.1 | 0.2 | 0.2 | 50 | Good | |
| Test 3 | 50 | 0.1 | 0.8 | 0.5 | 30 | Good | |
| Test 4 | 50 | 0.3 | 0.2 | 0.2 | 30 | Good | |
| Test 5 | 50 | 0.3 | 0.8 | 0.5 | 30 | Good | |
| Test 6 | 100 | 0.1 | 0.2 | 0.2 | 30 | Good | |
| Test 7 | 100 | 0.1 | 0.8 | 0.5 | 30 | Good | |
| Test 8 | 100 | 0.3 | 0.2 | 0.2 | 30 | Good | |
| Test 9 | 100 | 0.3 | 0.8 | 0.5 | 30 | Good | |

TABLE 1-continued

| Program | Thickness of the winding belt (um) | Intervals of the first limiters/ second limiters (m) | Height of the first limiters/ second limiters (cm) | Winding speed of the winding belt (m/s) | Length of the winding belt (m) | Finished Appearance | Remark |
|---|---|---|---|---|---|---|---|
| Test 10 | 300 | 0.1 | 0.2 | 0.2 | 30 | Good | |
| Test 11 | 300 | 0.1 | 0.8 | 0.5 | 30 | Good | |
| Test 12 | 300 | 0.3 | 0.2 | 0.2 | 30 | Good | |
| Test 13 | 300 | 0.3 | 0.8 | 0.5 | 30 | Good | |
| Test 14 | 500 | 0.3 | 0.8 | 0.5 | 10 | Normal | The winding belt is thick, occupies space and has high winding tension |
| Controlled test 1 | 50 | — | — | 0.2 | 10 | Poor | |
| Controlled test 2 | 100 | — | — | 0.5 | 10 | Poor | |

The above are only optional embodiments of the present disclosure, it should be pointed out that for those of ordinary skill in the art, improvements can be made without departing from the inventive concept of the present disclosure, which should all fall within the protection scope of the present disclosure.

What is claimed is:

1. A reel mechanism, comprising:
a rotating roller; and
a winding belt wound around a surface of the rotating roller;
wherein the winding belt is configured for winding a flexible copper clad laminate;
wherein the reel mechanism further comprises first limit structures and second limit structures; the first limit structures and the second limit structures are arranged on one side of the winding belt away from the rotating roller; the first limit structures are spaced apart from the second limit structures in an axial direction of the rotating roller;
wherein the first limit structures and the second limit structures are arranged along a length direction of the winding belt; the first limit structures and the second limit structures protrude from a surface of the winding belt; a space between the first limit structures and the second limit structures is configured for accommodating the flexible copper clad laminate; when the winding belt is wound with at least two layers outside the rotating roller, adjacent layers of the winding belt are spaced apart by the first limit structures and the second limit structures.

2. The reel mechanism according to claim 1, wherein the first limit structures comprise at least two first limiters fixed on the one side of the winding belt away from the rotating roller and arranged along the length direction of the winding belt; the second limit structures comprise at least two second limiters fixed on the one side of the winding belt away from the rotating roller and arranged along the length direction of the winding belt; the first limiters and the second limiters protrude from the surface of the winding belt; a protruding height of the first limiters and a protruding height of the second limiters are in a range of 0.1 cm-1 cm.

3. The reel mechanism according to claim 2, wherein the protruding height of the first limiters is equal to the protruding height of the second limiters.

4. The reel mechanism according to claim 2, wherein an amount of the first limiters is equal to an amount of the second limiters, and the first limiters and the second limiters are respectively arranged on two sides of the winding belt.

5. The reel mechanism according to claim 2, wherein the first limiters are arranged at intervals; an interval between each two adjacent first limiters is in a range of 0.05 m-0.35 m; the second limiters are arranged at intervals; an interval between each two adjacent second limiters is in a range of 0.05 m-0.35 m.

6. The reel mechanism according to claim 2, wherein the first limiters and the second limiters are metal limiters.

7. The reel mechanism according to claim 6, wherein the first limiters and the second limiters are cage nuts.

8. The reel mechanism according to claim 1, wherein a thickness of the winding belt is in a range of 5 um-550 um.

9. A winding device for a flexible copper clad laminate, comprising:
the reel mechanism according to claim 1;
a driving component connected with the reel mechanism; and
the flexible copper clad laminate stacked on the surface of the winding belt away from the rotating roller;
wherein the driving component is connected with the rotating roller.

10. The winding device for the flexible copper clad laminate according to claim 9, wherein the flexible copper clad laminate comprises a metal foil and a film layer stacked on one side of the metal foil away from the winding belt; the film layer is a polyamic acid film or a liquid crystal polymer film.

* * * * *